United States Patent
Hoenk et al.

(10) Patent No.: US 8,680,637 B2
(45) Date of Patent: Mar. 25, 2014

(54) ATOMIC LAYER DEPOSITION OF CHEMICAL PASSIVATION LAYERS AND HIGH PERFORMANCE ANTI-REFLECTION COATINGS ON BACK-ILLUMINATED DETECTORS

(75) Inventors: Michael E. Hoenk, Valencia, CA (US);
Frank Greer, Pasadena, CA (US);
Shouleh Nikzad, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 257 days.

(21) Appl. No.: 13/167,677

(22) Filed: Jun. 23, 2011

(65) Prior Publication Data
US 2011/0316110 A1    Dec. 29, 2011

Related U.S. Application Data

(60) Provisional application No. 61/357,922, filed on Jun. 23, 2010.

(51) Int. Cl.
*H01L 21/02* (2006.01)

(52) U.S. Cl.
USPC ............................................. 257/437; 438/72

(58) Field of Classification Search
USPC ........................................... 257/437; 438/72
See application file for complete search history.

(56) References Cited

U.S. PATENT DOCUMENTS

| | | | | |
|---|---|---|---|---|
| 2001/0054730 A1* | 12/2001 | Kim et al. | ...................... | 257/301 |
| 2004/0071889 A1* | 4/2004 | Asakawa et al. | .............. | 427/402 |
| 2006/0068586 A1* | 3/2006 | Pain | .............................. | 438/643 |
| 2006/0243320 A1* | 11/2006 | Shimazaki | .................... | 136/252 |
| 2008/0111056 A1* | 5/2008 | Blacksberg et al. | ........ | 250/208.1 |

* cited by examiner

*Primary Examiner* — Wael Fahmy
*Assistant Examiner* — Sarah Salerno
(74) *Attorney, Agent, or Firm* — Milstein Zhang & Wu LLC; Joseph B. Milstein

(57) ABSTRACT

A back-illuminated silicon photodetector has a layer of $Al_2O_3$ deposited on a silicon oxide surface that receives electromagnetic radiation to be detected. The $Al_2O_3$ layer has an antireflection coating deposited thereon. The $Al_2O_3$ layer provides a chemically resistant separation layer between the silicon oxide surface and the antireflection coating. The $Al_2O_3$ layer is thin enough that it is optically innocuous. Under deep ultraviolet radiation, the silicon oxide layer and the antireflection coating do not interact chemically. In one embodiment, the silicon photodetector has a delta-doped layer near (within a few nanometers of) the silicon oxide surface. The $Al_2O_3$ layer is expected to provide similar protection for doped layers fabricated using other methods, such as MBE, ion implantation and CVD deposition.

19 Claims, 16 Drawing Sheets

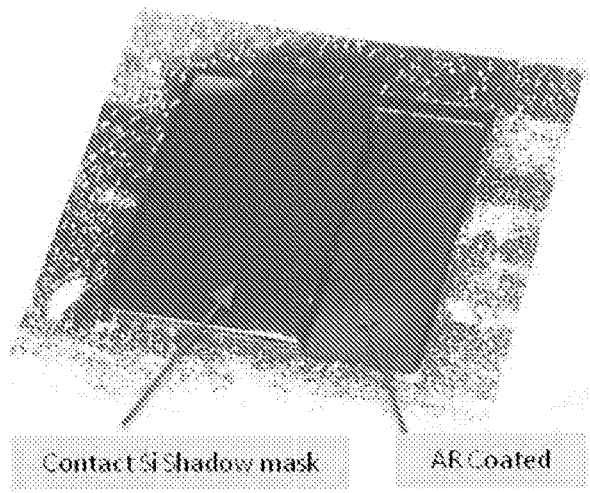
FIG. 3
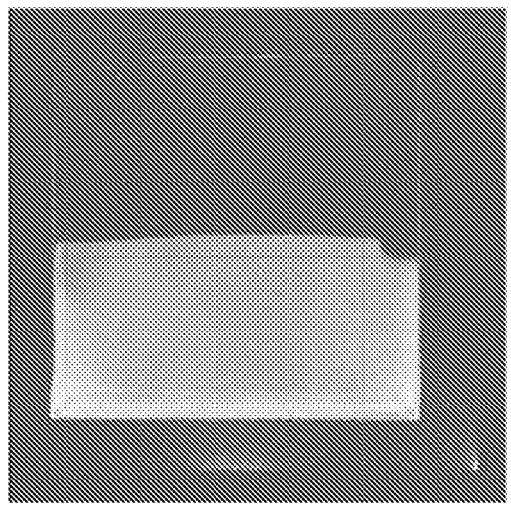 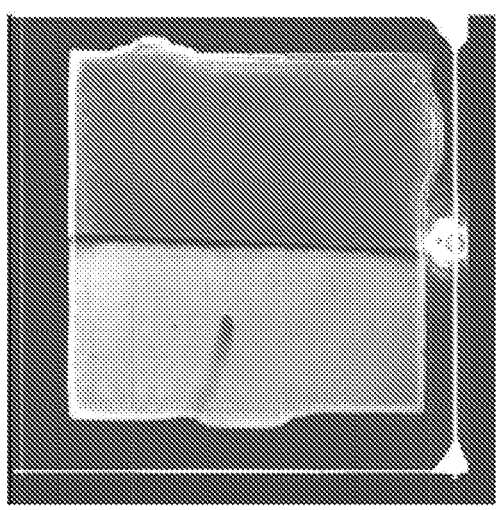
FIG. 4A          FIG. 4B

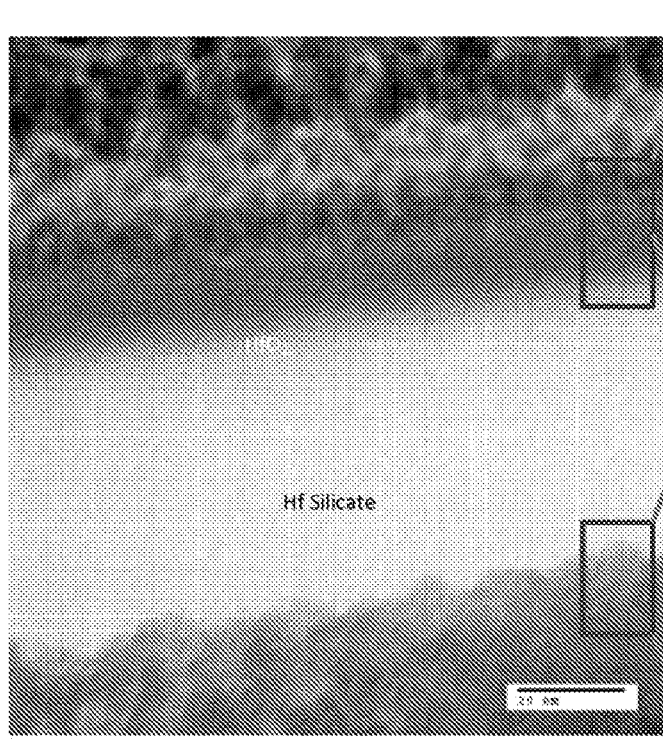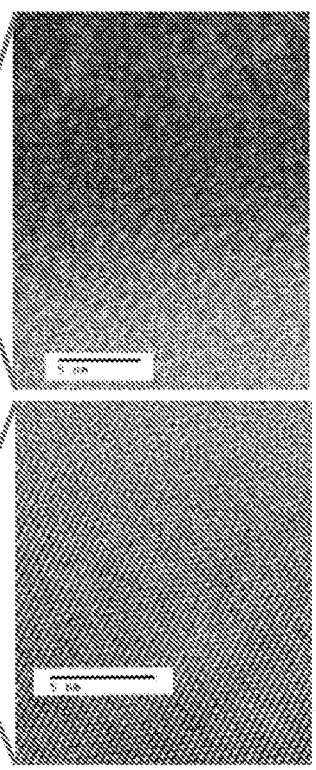
FIG. 9C
FIG. 9A FIG. 9B

ATOMIC LAYER DEPOSITION OF CHEMICAL PASSIVATION LAYERS AND HIGH PERFORMANCE ANTI-REFLECTION COATINGS ON BACK-ILLUMINATED DETECTORS

CROSS-REFERENCE TO RELATED APPLICATIONS

This application claims priority to and the benefit of U.S. provisional patent application Ser. No. 61/357,922, filed Jun. 23, 2010, which application is incorporated herein by reference in its entirety. This application is also related to U.S. patent application Ser. No. 12/965,790 filed Dec. 12, 2010 (which was published on Jun. 16, 2011 as U.S. patent application Publication No. 2011/0140246 A1), to U.S. patent application Ser. No. 13/160,534 filed Jun. 15, 2011, and to U.S. Pat. Nos. 4,798,598, 4,822,748, 4,882,609, 5,316,586, 5,376,810, 5,701,016, 6,403,963, 7,786,421 and 7,800,040, each of which patents, patent application publications and patent applications is incorporated herein by reference in its entirety, and all of which are commonly assigned to the assignee of the present application.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to charge coupled devices in general and particularly to a charge coupled device that includes an antireflection coating.

BACKGROUND OF THE INVENTION

Scientific grade silicon CCD detectors offer substantial improvements in performance for detection of photons in the ultraviolet (100-300 nm) range of the electromagnetic spectrum. In particular, back-illuminated CCDs constructed using delta-doping technology and that have been passivated exhibit at least 30% quantum efficiency (QE) over that entire range, compared to the ~5-10% achieved by microchannel plates that have been previously flown in space missions such as Galex. However, the performance of these delta-doped CCDs is limited due to the inherent reflectivity of the silicon itself. Anti-reflection coatings can, in principle, be applied to the silicon detector to improve the performance up to quantum efficiencies as high as 70%. However, the interface and film quality is critical for this theoretical performance to be achieved. Conventional sputtering and thermal evaporation techniques can be used to deposit films such as $HfO_2$, $MgF_2$, and MgO that should behave as anti-reflection coatings. However, recent experiments with these processes show that the film and interface quality achieved by these techniques are insufficient to achieve the desired quantum efficiency.

Transient Charging of Silicon Surfaces at High Illumination Intensities

High carrier concentrations, for example carrier concentrations that can be induced by intense illumination such as a laser pulse, can lead to many body effects, band flattening, and reduction in minority carrier lifetime near the surface. Despite the exceptionally high charge density in the delta-doped layer, these effects may lead to nonlinearities in the detector response. In general, the quantum efficiency observed at high illumination levels may be lower than the quantum efficiency observed at significantly lower illumination intensities. However, hot carriers produced at such high illumination levels should not induce permanent changes to the detector.

Degradation of Silicon Surfaces by Exposure to UV Radiation

At relatively low intensities, UV radiation can damage the $Si$—$SiO_2$ interface by hot carrier degradation of the oxide and consequent formation of interface traps, as described by U. Arp et al., "Damage to solid-state photodiodes by vacuum ultraviolet radiation," *Journal of Electron Spectroscopy and Related Phenomena*, 144-147: 1039-1042 (2005) and by P-S. Shaw et al., "Stability of photodiodes under irradiation with a 157-nm pulsed excimer laser," Applied Optics, 44(2): 197-207 (2005). Trap formation is cumulative, and potentially irreversible, which is one reason why surface and interface passivation technologies that rely on initially low defect densities, such as thermally grown oxides and hydrogen passivation, may not remain stable under UV illumination.

At higher intensities, such as those achievable with pulsed laser sources, a single laser pulse may carry enough energy to cause extremely rapid melting and recrystallization of the surface under nonequilibrium conditions, as described by I. Lukeš et al., "Study of Excimer Laser Induced Melting and Solidification of Si by Time-Resolved Reflectivity Measurements," *Applied Physics A*, 54: 327-333 (1992), by R. Černý et al., "Nonequilibrium Solidification of Monocrystalline Si Induced by ArF-Excimer-Laser Irradiation," *Thermochimica Acta*, 218: 173-182 (1993) and by T. Scheidt et al., "Ultraviolet pulse laser induced modifications of native silicon/silica interfaces analyzed by optical second harmonic generation," *Journal of Applied Physics*, 100, 023118 (2006).

Nonequilibrium melting/recrystallization of the silicon surface can occur upon exposure to excimer laser pulses above an energy threshold of ~0.4 $J/cm^2$. Scheidt et al. measured a damage threshold using a nonlinear optical technique that is sensitive to interface trap density. According to Scheidt et al., the damage threshold is based on peak intensity, so even if the average intensity over the beam is lower than the threshold, they still observe damage at the center of the beam. The damage threshold corresponds to melting and recrystallization induced by single-pulse exposures. However, multiple subthreshold pulses are observed to create interfacial traps, with a cumulative effect on the $Si$—$SiO_2$ interface. Assuming that the local temperature required to melt the surface is the same as the bulk silicon melting temperature (approximately 1410 C), then subthreshold exposures may cause high enough local temperatures to break bonds in the oxide. Silicon-hydrogen bonds can be broken at temperatures in the vicinity of 400-450 C, and $SiO_2$ decomposition at the silicon surface occurs at temperatures above 800 C. Because the decomposition of $SiO_2$ at the interface involves a chemical reaction with silicon at the interface, the chemical stability of the interface is also a potential concern under conditions of intense illumination.

At still higher intensities, laser ablation occurs, and the surface literally boils and explodes, leaving behind a crater, as described by Q. Lu et al., "Theory analysis of wavelength dependence of laser-induced phase explosion of silicon," *Journal of Applied Physics*, 104, 083301 (2008).

With respect to devices having a delta-doped layer, there are at least three potential damage mechanisms relating to high UV illumination fluxes that one should consider. These include UV illumination-induced modifications of the Si—SiO$_2$ interface (Scheidt et al.), UV illumination-induced oxidation of the interface as described by T. E. Orlowski, D. A. Manteli, "Ultraviolet laser-induced oxidation of silicon: The effect of oxygen photodissociation upon oxide growth kinetics," Journal of Applied Physics, 64(9): 4410-4414 (1988), and UV illumination-induced surface melting and recrystallization as described by Lukeš et al. and Černý et al.

UV-Induced Formation of Traps at the SI—SIO$_2$ Interface and in the Oxide

Unlike other surface passivation technologies, delta-doped CCDs exhibit excellent stability when only a native oxide is present on the surface. Moreover, the sharply-peaked electronic potential at the delta-doped layer serves as a tunnel barrier to suppress the injection of surface-generated dark current into the bulk silicon comprising the minority carrier collection volume of the detector. Consequently, for low illumination intensities, UV-induced trap formation is not expected to be a significant threat to the stability of the delta-doped surface. This is in sharp contrast with chemisorption charging, which is vulnerable to permanent band-flattening due to accumulation of interface and oxide trapped charge, enhanced surface-generated dark current due to trap formation at the Si—SiO$_2$ interface, and hot-carrier induced degradation of chemisorbed charge.

Under high photon fluxes, dynamic charging of the oxide may take place, as the surface is flooded with hot electrons and hot holes. In particular, different lifetimes of electron and hole traps in the oxide contribute to dynamic charging effects. These dynamic effects depend on materials and coating methods, including possible enhancement in thicker coatings due to the larger volumes involved. High quality, low defect oxides do not ensure long-term stability, as UV-induced damage is known to cause the formation of traps. Because of the high, localized charge in the delta-doped layer, the delta-doped surface is buffered against dynamic charging.

UV-Induced Chemical Reactions at the Interface

In delta-doped, n-channel CCDs and CMOS imaging arrays, the delta-doped surface comprises a sheet of dopant atoms typically located only 1-2 nm below the Si—SiO$_2$ interface. At these length scales and for high-intensity illumination, UV-induced chemical reactions are a potential concern, depending on the illumination intensity and the ambient environment. UV laser irradiation is known to cause oxidation of the silicon surface, especially at photon energies sufficient to cause photodissociation of oxygen, as described by Orlowski et al. Orlowski et al. compared irradiation at 193 nm and 248 nm, and showed that photodissociation of oxygen at the shorter wavelengths dramatically increases the oxidation rate. The highest laser intensities in the Orlowski study reached the melting/recrystallization threshold.

Melting/Recrystallization of the Silicon Surface

According to Lukeš et al., the depth to which melting occurs is sufficient to engulf the delta-doped layer. In some instances, an excimer laser can be powerful enough to induce melting/recrystallization of the surface when focused to sub-pixel spot sizes.

The ultraviolet represents an extremely important region of the electromagnetic spectrum as it has a critical role in a wide variety of scientific, commercial, and government applications. For example, ultraviolet spectroscopy can be utilized to study planetary atmospheres to determine whether basic elements for life such as oxygen, nitrogen, and hydrogen are present. A UV spectrometer can also detect evidence small quantities of complex organic molecules, (e.g., tholins), from the UV reflectivity of the surface of an icy moon providing information on how prebiotic chemistry takes place on extraterrestrial bodies. High sensitivity astronomical observations in the UV regime could enable the observation of faint emission from the baryons that form the intergalactic medium, which likely represent 50% of the detectable baryonic mass in the universe. Recent measurements enabled by the first all sky UV survey mission, GALEX, have uncovered a startling comet-like tail behind a red giant star that is streaking through space at nearly 300,000 miles per hour. This phenomenon is unique and can only be observed in the UV, and has now provided a means to characterize how stars can die and ultimately seed new solar systems through the shedding of carbon, oxygen, and other elements. Extreme UV lithography is utilized to pattern the finest features of the latest generation of semiconductor devices. UV laser inspection and imaging is therefore critical to identify defects in the fabrication process to maximize yield and reduce cost in this highly competitive industry. UV imaging has also recently been used in medical imaging to study how caffeine affects calcium ionic pathways in the brain. Rockets produce significant UV emission due to the production of excited nitrogen oxide species in their plumes. While infrared imaging is clearly an important anti-missile defense technology, UV can offer significant advantages in this application due to the ability to observe even in direct sunlight using "solar-blind" imaging. Bite marks can be readily observed and identified in forensic investigations since human saliva (wet or dry) shines brightly under UV illumination. Bruises are also evident for many days in UV after they have disappeared to the naked eye. As this only represents a small fraction of the real world applications of UV detectors, there is clearly strong motivation to have detectors with the highest possible sensitivity.

Unfortunately, despite this wide range of applications, scientific imaging in the ultraviolet is extremely difficult because the technology for sensing UV light is substantially limited by the quantum efficiency of available detectors and the transparency of optical coating materials. Many materials strongly absorb Near and Far UV light such that thicknesses of 20 nanometers or less are completely opaque. Thus, the UV throughput of an instrument is highly sensitive to impurities on, or contained in, any of the optical elements or the detector itself The absorption depth of UV photons is also very short, making collection of photo-induced current difficult with traditional materials. Compounding this problem is that many important sources of UV light are faint, so maximizing detector sensitivity is critical to unlock the true potential of UV imaging for the above applications.

TABLE 1

| | Typical Quantum Efficiency (155-300 nm) | Example of Current Use in Astronomy |
| --- | --- | --- |
| Cs$_2$Te Microchannel Plates | ~10% or less | GALEX Space Telescope |
| Silicon CCD coated with Lumogen | ~15-25% or less | Cassini ISS, Hubble Space Telescope |

Table 1 outlines two examples of ultraviolet sensitive detectors that are currently in use in space missions along with their typical quantum efficiencies in the near and far UV. Although new classes of III-V Nitride materials based on MBE or MOCVD grown GaN or AlGaN hold significant promise for future generations of UV detectors, they are expensive and extremely difficult to grow at sufficient quality to fabricate into imagers with low dark current and high responsivity. Silicon based charge coupled devices (CCDs), however, are based on the same fabrication technologies utilized in the semiconductor industry and are widely used in commercial imaging applications such as digital cameras.

This makes silicon CCDs cheap to manufacture with the added benefit that pixel design and layout are both extremely flexible. CMOS (Complementary Metal Oxide Semiconductor) based imagers are also widespread, and their use in commercial and scientific applications has been accelerating over the last few years due to the rapid progress of the overall CMOS industry. Unfortunately, the native oxide that naturally forms on silicon causes unfavorable distortions in silicon's electronic band structure in the near surface region. This leads to the capture of UV produced photoelectrons in surface traps and thus very poor response below 300 nm for silicon imagers. This can be overcome though a combination of techniques known as back illumination and back surface passivation.

Prior art methods, such as chemisorption and ion implant/laser anneal, do exist to passivate the back surface of silicon CCDs. However, these methods have limitations in that they either do not achieve 100% internal quantum efficiency, have undesirably high dark current, and/or are subject to hysteresis and stability issues due to adsorption of oxygen and other gases in the environment on the surface of the CCD. There are also issues relating to the use of antireflection coatings with such passivation systems.

There is a need for systems and methods that can prevent damage to delta-doped back surface illuminated CCD photodetectors designed to operate in the UV region of the electromagnetic spectrum.

SUMMARY OF THE INVENTION

According to one aspect, the invention features a silicon photodetector. The silicon photodetector comprises a silicon die having at least one photodetector element configured to detect electromagnetic radiation in a wavelength of interest, the silicon die having a silicon surface configured to receive the electromagnetic radiation, and having at least one terminal configured to provide an electrical signal representative of a property of the electromagnetic radiation, the silicon die having a doped layer situated within 5 nanometers of the surface, the silicon die having a silicon oxide layer with a first oxide surface adjacent the silicon surface and a second oxide surface on a side opposite the first oxide surface; a buffer layer comprising a chemically-resistant material having a first buffer layer surface adjacent the second surface of the silicon oxide layer, the buffer layer of the chemically-resistant material having a thickness configured to render the buffer layer of chemically-resistant material optically innocuous at the wavelength of interest, and having a second buffer layer surface on a side opposite the first buffer layer surface; and an antireflection layer configured to be transparent to electromagnetic radiation in the wavelength of interest, the antireflection layer having a first antireflection layer surface adjacent the second buffer layer surface. The buffer layer is configured to prevent the electromagnetic radiation in the wavelength of interest from causing a chemical reaction of the silicon oxide layer with the antireflection layer.

In one embodiment, the doped layer situated within 5 nanometers of the surface is a delta-doped layer.

In another embodiment, the doped layer situated within 5 nanometers of the surface is a doped layer fabricated using MBE technology.

In still another embodiment, the doped layer situated within 5 nanometers of the surface is a doped layer fabricated using ion implantation.

In a further embodiment, the doped layer situated within 5 nanometers of the surface is a doped layer fabricated using chemical vapor deposition.

In one embodiment, the buffer layer comprising a chemically-resistant material is $Al_2O_3$.

In another embodiment, the $Al_2O_3$ buffer layer has a thickness in the range of 1 nm to 23 nm.

In yet another embodiment, the antireflection layer comprises at least one material selected from the group of materials consisting of $HfO_2$, $MgF_2$, $Al_2O_3$, $SiO_2$, LiF, $Si_3N_4$, and MgO.

In still another embodiment, the electromagnetic radiation in a wavelength of interest is electromagnetic radiation in the wavelength range of 100 nm to 300 nm.

According to another aspect, the invention relates to a method of providing an antireflection layer on a silicon photodetector. The method comprises the steps of providing an silicon photodetector comprising a silicon die having at least one photodetector element configured to detect electromagnetic radiation in a wavelength of interest, and having at least one terminal configured to provide an electrical signal representative of a property of the electromagnetic radiation; producing on the silicon die a doped layer with an overcoat of silicon configured to situate the doped layer within 5 nanometers of a silicon surface; creating a silicon oxide layer with a first oxide surface adjacent the silicon surface and a second oxide surface on a side opposite the first oxide surface; depositing on the second oxide surface of the silicon oxide layer a buffer layer comprising a chemically-resistant material having a first buffer layer surface adjacent the second surface of the silicon oxide layer, the buffer layer of the chemically-resistant material having a thickness configured to render the buffer layer of chemically-resistant material optically innocuous at the wavelength of interest, and having a second buffer layer surface on a side opposite the first buffer layer surface; and depositing on the second buffer layer surface an antireflection layer configured to be transparent to electromagnetic radiation in the wavelength of interest, the antireflection layer having a first antireflection layer surface adjacent the second buffer layer surface. The buffer layer is configured to prevent the electromagnetic radiation in the wavelength of interest from causing a chemical reaction of the silicon oxide layer with the antireflection layer.

In one embodiment, the doped layer situated within 5 nanometers of the surface is a delta-doped layer.

In another embodiment, the doped layer situated within 5 nanometers of the surface is a doped layer fabricated using MBE technology.

In still another embodiment, the doped layer situated within 5 nanometers of the surface is a doped layer fabricated using ion implantation.

In a further embodiment, the doped layer situated within 5 nanometers of the surface is a doped layer fabricated using chemical vapor deposition.

In one embodiment, the buffer layer comprising a chemically-resistant material is a buffer layer of $Al_2O_3$.

In another embodiment, the buffer layer of $Al_2O_3$ has a thickness in the range of 1 nm to 23 nm.

In still another embodiment, the buffer layer of $Al_2O_3$ is deposited using atomic layer deposition.

In yet another embodiment, the antireflection layer comprises at least one material selected from the group of materials consisting of $HfO_2$, $MgF_2$, $Al_2O_3$, $SiO_2$, LiF, $Si_3N_4$, and MgO.

According to yet another aspect, the invention relates to a silicon photodetector. The silicon photodetector comprises a silicon die having at least one photodetector element configured to detect electromagnetic radiation in a wavelength of interest, the silicon die having a silicon surface configured to receive the electromagnetic radiation, and having at least one terminal configured to provide an electrical signal representative of a property of the electromagnetic radiation, the silicon die having a doped layer situated within 5 nanometers of the surface, the silicon die having a silicon oxide layer with a first oxide surface adjacent the silicon surface and a second oxide surface on a side opposite the first oxide surface; and a chemical passivation layer comprising a chemically-resistant material having a first chemical passivation layer surface adjacent the second surface of the silicon oxide layer, and having a second chemical passivation layer surface on a side opposite the first chemical passivation layer surface, the chemical passivation layer configured to be transparent to electromagnetic radiation in the wavelength of interest, the chemical passivation layer configured to prevent the electromagnetic radiation in the wavelength of interest from causing a chemical reaction of the silicon oxide layer.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 3 is an image that demonstrates a shadow masking approach used in depositing AR coatings. A diced silicon wafer was placed in direct contact with the thin imaging membrane to block the deposition of the AR coating from a portion of the device. This shadow masking is used to ensure that coated and uncoated references were present within the same device.

FIG. 4A and FIG. 4B are flat field images produced by delta-doped back-illuminated silicon CCDs when illuminated with 300 nm light. The top of each image comes from the half of the CCD that was coated with a sputtered film. FIG. 4A shows an image obtained from a CCD having the top half coated with sputtered MgO film. FIG. 4B shows an image obtained from a CCD having the top half coated with sputtered $HfO_2$ film. The brightness of the image is proportional to the quantum efficiency (QE). In each case, the half of the CCD that is sputter coated demonstrates lower quantum efficiency than the uncoated side.

FIG. 8A shows the quantum efficiency vs. wavelength for two individual delta-doped CCDs partially coated by 16.5 nm thick ALD $Al_2O_3$ AR coating. Device #1 was a conventional CCD, while Device #2 is an electron multiplied CCD with gain. There is no measurable quantitative or qualitative difference between the two devices, when the error bars (+/−5%) are taken into account. The depositions were carried out using the same deposition recipe, but were separated in time by a month between coatings.

FIG. 9A is a TEM image of PEALD $HfO_2$ grown on a blank delta-doped silicon wafer. The PEALD process forms an interfacial Hf silicate layer despite the presence of the native oxide that forms after the delta-doping process. The prevention of the formation of this silicate layer provides the motivation for the ultrathin (2 nm) aluminum oxide barrier layer grown for the $HfO_2$ AR coatings. In FIG. 9A the dark reference bar is 20 nm long. FIG. 9B and FIG. 9C are higher magnifications images of interface regions in the device, shown with a dark reference bar that is 5 nm long.

FIG. 13A shows the index of refraction vs. wavelength of HfO$_2$ and HfO$_2$/Al$_2$O$_3$ bilayer coatings. The ALD coatings have higher index of refraction over the entire wavelength range of the near UV (NUV) band, which is indicative of a higher quality thin film as it is closer to the value for the bulk material. FIG. 13B is a graph showing the absorption coefficient vs. wavelength, as modeled by UV spectroscopic ellipsometry for HfO$_2$ and HfO$_2$/Al$_2$O$_3$ bilayer AR coatings. The ALD bilayer, denoted by numeral 1320, shows the lowest absorption over the wavelength range of 265 to 300 nm. Curves marked 1310 are those for ALD HfO$_2$. Curves marked 1330 are those for sputtered HfO$_2$.

DETAILED DESCRIPTION

Figure 1:
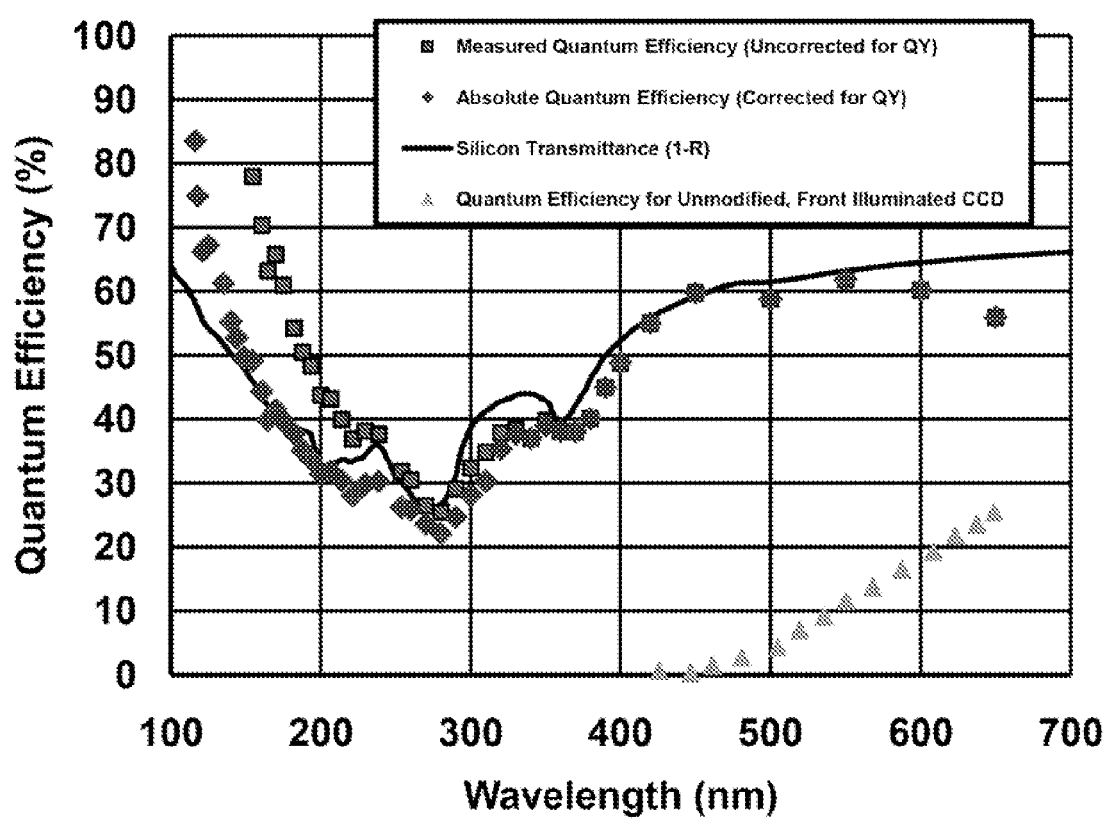
FIG. 1 is a graph that shows the measured and absolute quantum efficiency for a back-illuminated, delta-doped silicon CCD. Note that the data, once corrected for quantum yield, lies along the silicon transmittance curve. This indicates that the CCD is exhibiting reflection-limited response and 100% internal quantum efficiency. Data for an unmodified, front-illuminated CCD is shown for comparison purposes to illustrate the improvement in UV sensitivity that is achieved by the delta-doping and back-illumination processes.

Atomic Layer Deposition (ALD) is a thin film deposition technique similar to chemical vapor deposition (CVD) in which a desired film is grown using sequential surface reactions, one monolayer at a time. The ALD method enables the growth of smooth, dense, pin-hole free films with angstrom level thickness control over arbitrarily large surface areas. In particular, the layer by layer growth allows one to precisely tailor the interface between the imager where the photons are adsorbed and the anti-reflection coating. This is highly advantageous as the MBE grown delta-doped layer is located less than 2 nm from the surface of the imager, and any reaction at the interface with the AR coating, for example, forming HfSiO$_4$ (hafnium silicate), would disrupt the surface and degrade the device performance. Using the atomic scale control of the surface that is achievable with delta-doping and atomic layer deposition, both the stability and the interfacial band offsets are amenable to engineered improvements by the design of the delta-doped layer structure, and by the incorporation of nanometer-scale interlayers that have reduced chemical reactivity at the interface.

Chemical Passivation Using ALD

One can chemically passivate the silicon surface using ALD growth of stable, nanometer-scale passivation layers. SiO$_2$ is known to be unstable over time, and other surface coatings have been proven to be more stable against UV-induced damage. Chemical passivation of the interface can be done by coating the surface with a thin layer of Al$_2$O$_3$, either on top of the native SiO$_2$ or on a hydrogen-passivated surface. If an antireflection coating is desired, the same process can be used to incorporate a chemically stable interlayer (such as Al$_2$O$_3$) between the silicon surface and the antireflection coating. Such an interlayer is expected to improve the stability of the surface against UV-induced chemical reactions at the interface. A chemical passivation layer can prevent laser-induced chemical reactivity from causing permanent damage to the silicon surface or surface passivation layer.

High performance surface passivation layers, such as delta-doping and multilayer doping layers formed by molecular beam epitaxy, may require protection against UV-induced oxidation or other chemical attack to the silicon surface. A chemical passivation layer, such as a layer of Al$_2$O$_3$ that is between 1 nm and 2 nm in thickness is expected to prevent such chemical attacks from damaging the surface passivation layer. A chemical passivation layer is expected to extend the lifetime of the detector by slowing the rate of chemical attack. A chemical passivation layer is expected to extend the lifetime of detectors exposed to UV laser radiation.

Our work on anti-reflective ALD Al$_2$O$_3$ as a single layer anti-reflective coatings has been demonstrated to have >50% QE at 180 nm. This same approach using different chemical precursors suitable for deposition of MgF$_2$, MgO, HfO$_2$ and other dielectrics is expected to provide antireflection coatings covering the 100-300 spectral range with a promise of reaching 50-70% QE and potentially improving the current UV QE by nearly an order of magnitude, as compared to GALEX detectors having a QE of about 5-10%.

In one embodiment, wafers of Si CCD detectors were diced into "raft" sections with 12 die per raft. These rafts were thinned using standard wet processing techniques to produce frame supported Si membranes for each die. These membranes were cleaned to remove surface contamination and oxides, and were subsequently delta-doped by MBE. The completed raft was then diced into the 12 individual die. The die were individually cleaned. To apply an AR coating, one of these die was loaded into an Atomic Layer Deposition system. A shadow mask was placed on the imaging surface to define a coated and uncoated region. An antireflection coating was applied. The coated region was verified to have the desired QE by testing the device in a vacuum UV test stand.

Prior to this work, we were unaware of any anti-reflection coatings that have been successfully demonstrated for silicon based imagers in the 100 nm-250 nm range of the ultraviolet spectrum. Atomic layer deposition is the first successful approach that can be used over this entire wavelength range due to its ability to produce high quality Al$_2$O$_3$, MgO, MgF$_2$, $SiO_2$, and $HfO_2$ coatings. In the present embodiments, extremely thin ALD $Al_2O_3$ layers (~1 nm thick) are used as buffer layers between the MBE delta-layer and the potentially reactive AR coatings. The 1 nm ALD $Al_2O_3$ is sufficiently thin to be optical inactive, but thick enough to be a chemical barrier to preserve separation the silicon and AR coatings. This approach of ultra-thin barrier layers embedded in multilayer AR coatings can only be accomplished with methods such as ALD that allow the deposition of substantially monoatomic layers.

We describe a new technique that combines the atomic precision of molecular beam epitaxy and atomic layer deposition, to fabricate silicon CCD detectors that demonstrate high detector quantum efficiency (>50%) in the near and far ultraviolet (155 nm-300 nm). We describe in detail the unique surface engineering approaches used and demonstrates the robustness of detector performance that is obtained by achieving atomic level precision at all steps in the fabrication process. The characterization, materials, and devices produced are compared to results obtain using other approaches. As ultraviolet imaging systems have the potential to detect life on other planets, explain the origins of the universe, identify defects in the latest generation of semiconductor devices, perform medical imaging and brain mapping, improve missile defense, and even solve crimes, this new approach to UV detector fabrication is expected to have an important impact on a wide range of fields.

Surface passivation by delta-doping using silicon molecular beam epitaxy, enables precise control over the band structure at the CCD surface to get ideal Si reflection-limited response (see FIG. 1). U.S. patent application Ser. No. 12/965,790 filed Dec. 12, 2010 (which was published on Jun. 16, 2011 as U.S. patent application Publication No. 2011/0140246 A1), U.S. patent application Ser. No. 13/160,534 filed Jun. 15, 2011, and U.S. Pat. Nos. 4,798,598, 4,822,748, 4,882,609, 5,316,586, 5,376,810, 5,701,016, 6,403,963, 7,786,421 and 7,800,040 give a thorough description of delta-doping theory and practice as applied to back illuminated image detectors.

Even with ideal back surface passivation, the inherent reflectivity of silicon significantly limits the absolute detector quantum efficiency of silicon CCDs. This is illustrated by the dip in quantum efficiency to ~25% near 280 nm in FIG. 1. Therefore, anti-reflection (AR) coatings should be utilized to maximize imaging performance. Modeling results predict that absolute quantum efficiencies of greater than 50% should be achievable from in the near and far UV (100 nm-300 nm). We define absolute quantum efficiency here as the probability of a photon incident at the detector surface will generate an electron that is detected by the detector element. This is to be distinguished from internal quantum efficiency which subtracts out reflection losses, and only considers those photons which have the opportunity to be absorbed by the detector. Note that single photons at very short wavelengths can produce more than one electron when they are absorbed by a silicon detector. Therefore, we correct our calculations of absolute quantum efficiency for this gain factor, taking into account that the quantum yield of those photons is greater than unity.

AR coatings are widely utilized for many detector systems (silicon, III-V, and others) in the visible and infrared to improve absolute quantum efficiency. However, producing UV anti-reflection coatings is extremely challenging as the coatings must be extremely high quality. The AR coatings preferably should exhibit low impurity/defect concentration to avoid UV absorption, and preferably should be pinhole free and dense to prevent humidity interaction with the imager surface. In addition, the index of refraction of silicon varies significantly over the UV, and therefore multiple different materials may be required to cover the Near and Far UV effectively. This is especially important because even ideal materials have absorption cut offs that make them opaque in certain regions of the UV. In addition, a change of 2 nm or less can dramatically shift the peak anti-reflection performance or lead to dramatic changes in absorption cutoffs, especially in the far UV, making controllable and reproducible fabrication of ultrahigh performance AR coated silicon CCDs difficult. Recent modeling results by Hamden et al. (submitted to Applied Optics (2011)) have demonstrated that the target thicknesses for UV anti-reflective coatings range from 10 to 25 nm. When all of these constraints are combined (back-illumination, silicon band structure engineering/surface passivation, and AR coating deposition with sub-nanometer precision and accuracy), a series of sequential robust, nanoscale, surface-engineering processes are required to produce the best possible UV sensitive CCDs.

Device Processing

Wafers containing fully fabricated CCDs of several types were acquired for from multiple commercial sources. These included flight spare CCD wafers, manufactured by Loral for the imagers in the Cassini spacecraft mission that is currently flying in the Saturn system, CCDs imagers obtained from EG&G Reticon, and wafers containing newly designed electron-multiplied CCDs (EM-CCDs) from e2v (of 520 White Plains Road, Suite 450, Tarrytown, N.Y. 10591). These EM-CCDs combine the high ultraviolet quantum efficiency of silicon imagers with a gain register which results in measurements with extremely high signal to noise ratio (as high as 10,000:1), enabling them to be utilized in photon counting applications. These three different types CCDs were utilized to demonstrate the robustness of the techniques in this investigation and show that this is a generally applicable approach to enhance the UV quantum efficiency of any type of silicon imager.

Figure 2:
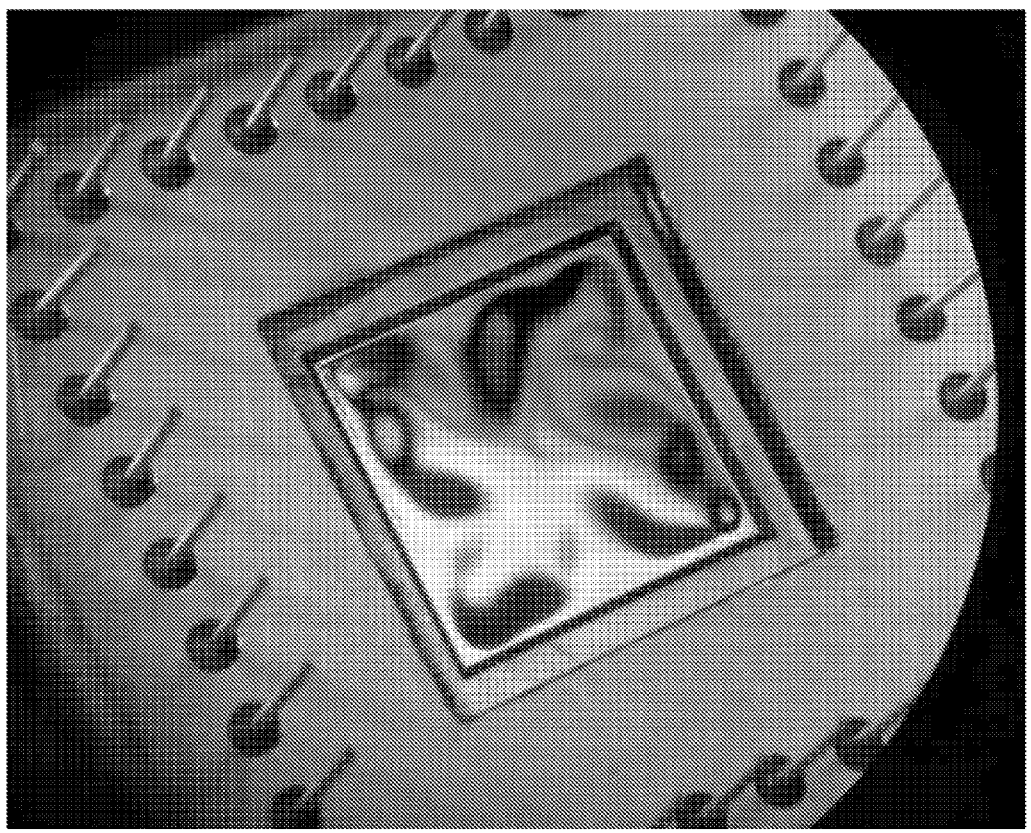
FIG. 2 is an image of a Cassini CCD that has been frame thinned to enable back-illumination for proof-of-concept demonstration of ultrahigh absolute UV quantum efficiency. Its front side detection electronics are face down as pictured. This CCD is mounted in a picture frame package with a window cut to enable the backside illumination. The clover leaf pattern evident in the thin membrane is due to compressive stresses present in the processed silicon. An alternative thinning approach involves the use of a handle wafer to support the imaging membrane. This approach eliminates the deformation and is appropriate for high volume production of scientific grade CCDs.

The CCDs were set up for back-illumination to remove the front side circuitry from the photon pathway. The bulk thickness of the CCDs is reduced by polishing and chemical etching to leave a thin membrane. The final thickness of the membrane after this process is thick enough so that it has sufficient mechanical strength to withstand its environment. The membrane is also thin enough so that charge carriers produced at the back surface do not drift too far laterally as they are swept to their destination pixel on the front side. This maps the point of photon impact to a specific front side pixel in the image. CCDs are produced with an epitaxial layer that provides a natural definition for the membrane thickness. It is uniform across the entire CCD and provides a chemical etch-stop for the thinning process. The membrane is created in a way that makes it monolithic with a thick frame of original silicon from the CCD. The front side CCD circuitry resides over regions that are thick frame and thin membrane. The thick frame serves the purpose of mechanically supporting the membrane and it makes it convenient to wire bond the imaging device using its existing bond pads. Residual stresses in the imaging membrane can result in macroscale deformations when the frame thinning approach is used (see FIG. 2). However, this frame thinning approach is a relatively easy and inexpensive way to provide back-illumination in a silicon CCD, and therefore is ideal for proof of concept demonstrations. Backside illumination processes where the entire CCD is thinned are currently commercially available, but these fabrication processes are not compatible with the MBE and ALD techniques that are used in the embodiments described. An alternative approach where the entire CCD is thinned that is compatible with MBE and ALD is believed to be possible and would offer some advantages.

In the frame thinning approach, the backside of the CCD wafer is polished by chemical mechanical polishing (CMP) and the membrane region is defined by a nitride mask on the polished surface. The bulk silicon is aggressively etched by hot 55% KOH except for the frame defined by the nitride mask. We monitor the progress of the etch and terminate when it comes within 20 microns of the known epitaxial layer thickness. The surface texture of the KOH etch is rough by comparison to the CMP surface. This condition is rectified by the next step in which etching is performed using a specific mixture of hydrofluoric, nitric and acetic acids (HNA) in the relative volumes of 1:3:8. This mixture of HNA continues the etch to the epitaxial layer where it self-terminates upon exhaustion of bulk silicon. The well defined etch stop is caused by the higher resistivity of the epitaxial layer. The epitaxial layer has many orders of magnitude fewer charge carriers on hand for participation in the chemical reaction of the etch. The etch reaction stops as it is starved for charge carriers. Additional brief etch exposures are made to mixtures of 1:40:15 HNA and $KMnO_4$/HF. These solutions help to remove certain stains and haze which are left by the previous reactions. The resulting thin membrane has a smooth mirror-like specular finish.

The CCDs are brought into an inert and clean glove box environment to prepare for electrical passivation and band structure engineering. A UV ozone clean is utilized to remove carbon and other organics, and a HF-ethanol spin clean is utilized to remove the native oxide from the imaging membrane. The backside surface of the imager is then passivated by delta-doping. Briefly, in delta-doping, an extremely thin silicon layer is grown epitaxially using a low temperature (lower than 450° C.) molecular beam epitaxy process. This silicon epitaxially grown layer is delta-doped during the growth process by incorporating a third of a monolayer of boron atoms, effectively as a single atomically thin sheet that does not interrupt the overall silicon epitaxy, but dramatically affects the electronic band structure of the silicon in the near surface region. This delta-doped layer enables the CCD to operate at 100% internal quantum efficiency (QE), limited only by reflection of light from the silicon surface. In some embodiments, a plurality of delta-doped layers, separated by layers of silicon having no deliberately added dopants, may be provided, as described in more detail in U.S. patent application Ser. No. 13/160,534.

Anti-reflection (AR) coatings were tested to improve the imaging performance of these silicon CCDs. However, the index of refraction of the silicon changes significantly in the ultraviolet region of the spectrum, especially from 100 to 300 nm. Therefore, to obtain optimum quantum efficiency, it was necessary to test multiple different thin film coatings and coating methods. Contact shadow masks such as the one shown in FIG. 3 were utilized to ensure that all AR coated CCDs had an internal, uncoated standard for comparison to validate subsequent measurements of QE. Thin film coating techniques including physical sputtering, electron beam evaporation, thermal evaporation, and atomic layer deposition were utilized and the results evaluated.

Once the AR coatings were applied to the CCDs, they were packaged for testing in a custom built UV-Visible CCD characterization system described in Jacquot, B. C. et al., "A system and methodologies for absolute QE measurements from the vacuum ultraviolet through the NIR," *Rev Sci Instrum* (2011, in review). Briefly, imaging performance of the CCD was characterized from 121.6 nm to 650 nm starting from the longer wavelength end of the spectrum by taking flat field images over controlled exposure times. Two separate light sources were used for illumination (Deuterium lamp at FUV and Tungsten-Halogen for NUV). Absolute QE measurement was made by comparison to a NIST calibrated photodiode that could be positioned in the same location as the CCD being characterized. Some of the CCD characterization data was obtained at Reticon in a different testing system of similar design.

Thinned, delta-doped Cassini and Reticon CCDs were utilized to evaluate thin film AR coating techniques and materials for their ability to improve absolute detector quantum efficiency. Magnesium oxide and hafnium oxide were deposited by physical sputtering. Hafnium oxide AR coatings were also deposited by electron beam evaporation and thermal evaporation. Hafnium oxide and aluminum oxide were deposited by atomic layer deposition. This combination of materials and deposition methods was chosen to elucidate the efficacy of each deposition technique within the constraints of the limited number of CCDs available for the experiments. Examples of flat field images obtained from some of the partially AR coated CCDs produced in this work are shown in FIG. 4. FIG. 4 shows flat field images taken by two partially AR coated Cassini CCD under 300 nm UV illumination. The darker regions were sputter coated with magnesium oxide (MgO) and hafnium oxide ($HfO_2$) respectively, while the brighter regions were protected by the shadow mask. The relative performance of the coated and uncoated regions was counter to expectations as the brightness of these flat field images is directly related to the absolute quantum efficiency of the detector. The short wavelength flat field brightness is enhanced because the quantum yield is greater than one, but in all cases a brighter image indicates greater sensitivity.

Figure 5A:
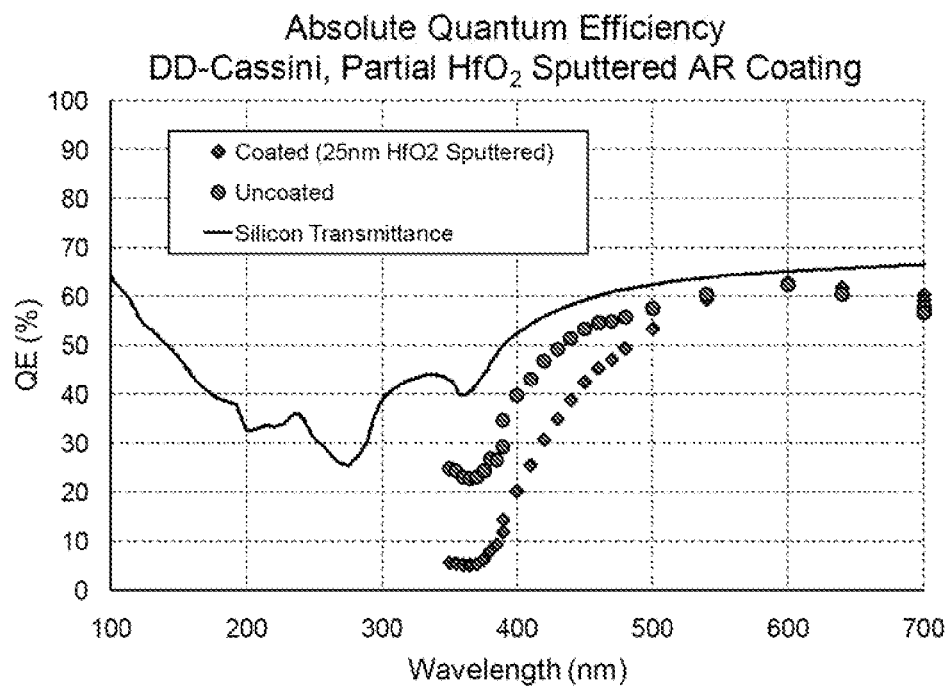
FIG. 5A is a graph illustrating the quantum efficiency vs. wavelength for the AR coated and uncoated sides of a delta-doped CCD having an $HfO_2$ AR coating by applied by sputter deposition. The quantum efficiency of the coated side of the CCD has worse performance.
Figure 5B:
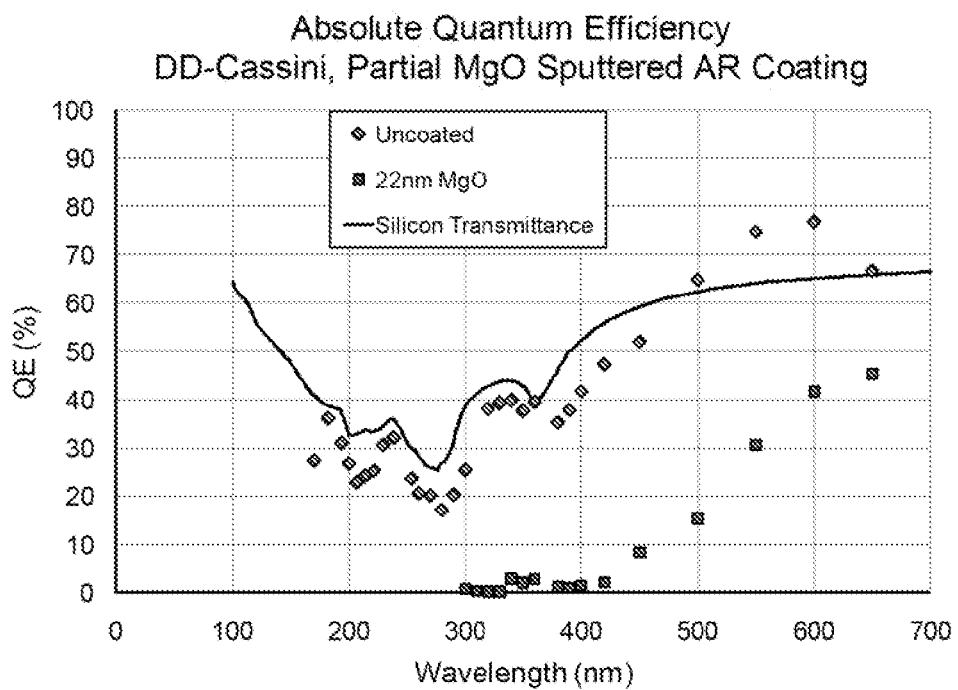
FIG. 5B is a graph illustrating the quantum efficiency vs. wavelength for the AR coated and uncoated sides of a delta-doped CCD having an MgO AR coating by applied by sputter deposition. The quantum efficiency of the coated side of the CCD has worse performance.
Figure 6:
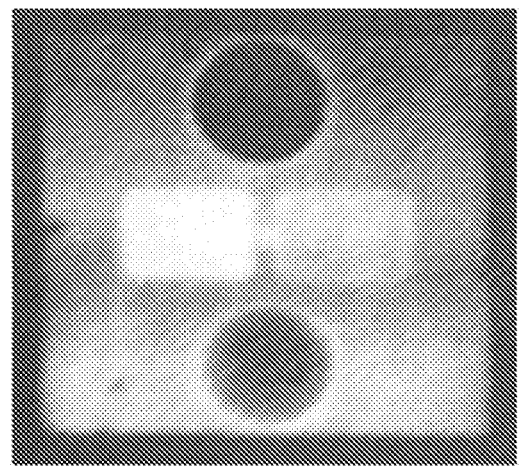
FIG. 6 is a flat field image of a delta-doped CCD taken under 270 nm illumination. The dark circles at the top and bottom of the image are regions that were coated with $HfO_2$ using electron beam evaporation. It is believed that X-ray damage during the evaporation degraded the CCDs imaging capability in these regions. The bright rectangular regions were coated with $HfO_2$ using thermal evaporation.

FIG. 5 shows a plot of the quantum efficiency of these two CCDs over a range of wavelengths. The performance of the MgO coating was poor over the entire range of wavelengths. The $HfO_2$ coating was roughly identical to the uncoated side in the range of visible wavelengths, but dropped off significantly in the ultraviolet. FIG. 6 shows the 270 nm flat field image of a Reticon CCD partially AR coated with hafnium oxide in four different regions. The two dark circular regions of the device were AR coated using e-beam evaporation and the two square regions are AR coated using thermal evaporation. The dark AR coated regions of the device are believed to have failed due to the exposure of the CCD to x-rays during the electron beam evaporation process. The brighter regions, coated by thermal evaporation of $HfO_2$, demonstrate the successful application of a functioning AR coating.

Figure 7:
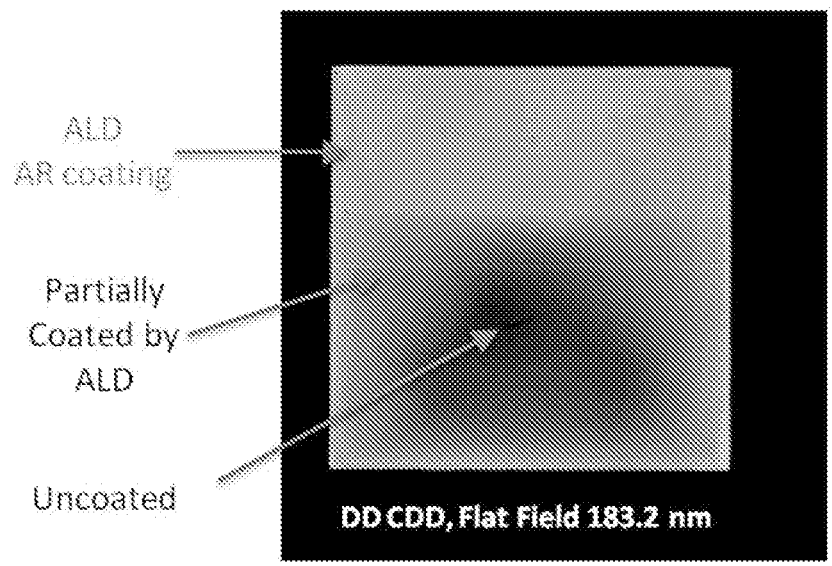
FIG. 7 is a flat field image produced by a delta-doped AR coated back-illuminated silicon CCD when illuminated with 183.2 nm light. The top of this image comes from the portion of the CCD that is coated with a plasma enhanced atomic layer deposition (PEALD) $Al_2O_3$ film. The brightness of the image is proportional to the quantum efficiency (QE). The side of the CCD that is AR coated has significantly higher quantum efficiency than the uncoated side. The shadow masking used (see FIG. 3) is imperfect for this device due to the highly conformal nature of ALD deposition processes which allows the coating to sneak under the shadow mask.

FIG. 7 shows the 183.2 nm flat field of a Cassini CCD partially AR coated with aluminum oxide by plasma enhanced atomic layer deposition (PEALD). The demarcation between the brighter, AR coated region at the top, and the uncoated region at the bottom is blurred compared to the flat field images obtained for AR coatings applied using sputtering, e-beam evaporation, and thermal evaporation techniques. This is due to the highly conformal nature of the ALD process. The contact shadow masking technique (shown in FIG. 3) has limitations due to the compressive stresses present in the thin silicon membrane. The raised clover-leaf pattern in the membrane (shown in FIG. 2) causes the shadow mask to be elevated above a certain portion of the imaging surface. That allows the ALD process to partially coat the shadowed regions because the ALD precursors can penetrate under the mask. However, this is not a concern for the real world applicability of these techniques. It is noted here again that the purpose of the shadow mask is only to provide an internal standard for an uncoated delta-doped CCD. The ultimate applications for these UV AR coatings are expected to require uniform blanket coatings over an entire CCD, thereby eliminating the shadow masking requirement.

Figure 8A:
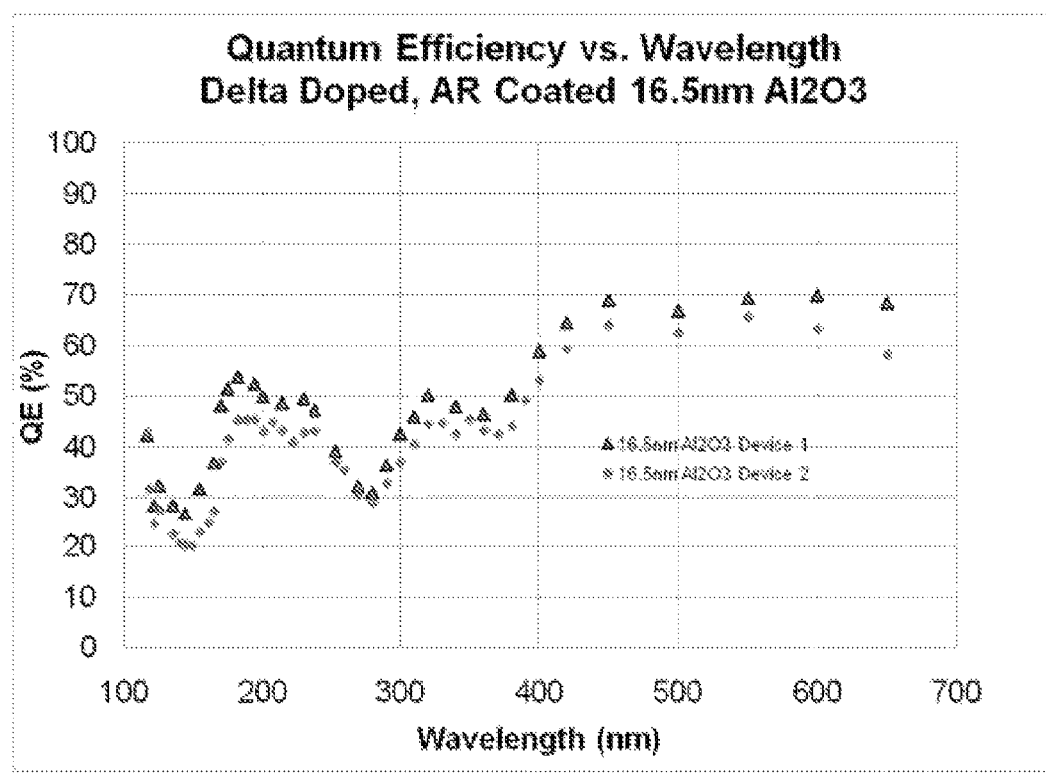
FIG. 8A is a graph that demonstrates the repeatability and control of the ALD technique.
Figure 8B:
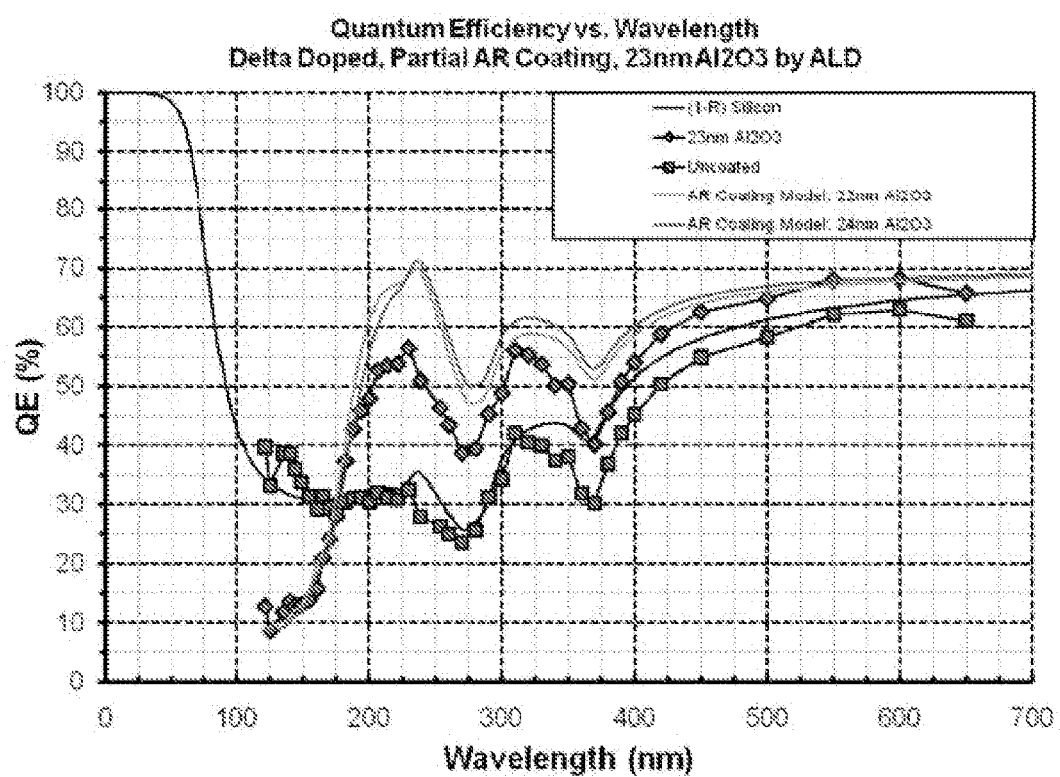
FIG. 8B is a graph that compares the modeled and the measured performance of a 23 nm thick ALD $Al_2O_3$ AR coated CCD. The qualitative QE behavior predicted by the model matches the measured performance reasonably well.

The design and accurate prediction of the performance of ALD AR coatings was straightforward due to the inherent reproducibility and control of the ALD technique. FIG. 8A shows the performance of a conventional and EM-CCD coated with a 16.5 nm AR coating of aluminum oxide. Their measured quantum efficiency is the same both qualitatively and quantitatively over the entire wavelength range tested despite there being a month between deposition runs. The modeled performance of the coatings also matches the measured data extremely well. FIG. 8B shows that a 23 nm aluminum oxide, deposited by scaling to the appropriate number of ALD cycles based on the 16.5 nm result, displays quantum efficiency that qualitatively matches that of the predicted values. The absolute QE is a bit lower than the modeled value, as the absorption parameters used in the TFCalc™ model are taken from the literature for bulk materials. TFCalc™ is available from Software Spectra, Inc., 14025 N.W. Harvest Lane, Portland, Oreg. 97229-3645, USA.

Figure 10:
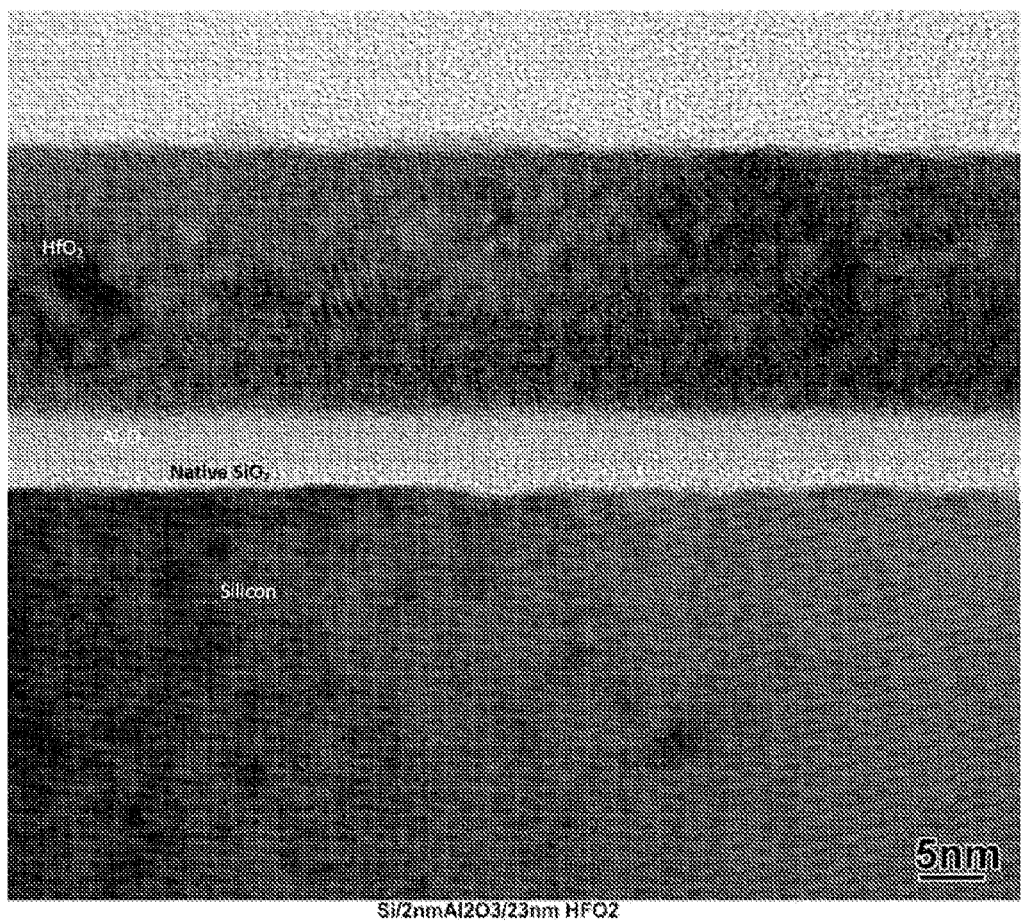
FIG. 10 is a TEM image of a PEALD $HfO_2/Al_2O_3$ bilayer grown on a blank delta-doped silicon wafer. The presence of the thin (2 nm) aluminum oxide barrier layer prevents the formation of the interfacial layer observed when a PEALD $HfO_2$ AR coating is applied directly to delta-doped silicon (compare FIG. 9).

As ALD's inherent advantages of control and uniformity make the technique preferable to thermal evaporation, PEALD $HfO_2$ was also pursued. However, since remote plasma ALD of hafnium oxide on hydrogen terminated silicon is known to lead to the formation of a hafnium silicate interfacial layer, transmission electron microscopy was utilized to determine whether a similar silicate would form during $HfO_2$ deposition on a delta doped silicon wafer. An air exposure step occurs between the delta-doping process and the deposition of the ALD AR coating, so a native oxide silicon oxide is present prior to the ALD process. The TEM image in FIG. 9 shows that a large interfacial layer has formed between the ALD hafnium oxide (the dark layer at the top of the image) and the crystalline silicon substrate. Because this layer was observed, a 2 nm ALD aluminum oxide film was deposited in situ as a barrier, immediately prior to the ALD $HfO_2$ deposition during all further ALD $HfO_2$ AR coating experiments. A high resolution TEM image of this ALD bilayer is shown at left in FIG. 10. This image confirms that a high density, nanocrystalline $HfO_2$ film is produced and chemical interactions between the $HfO_2$ and the silicon are blocked by the intermediate $Al_2O_3$ layer.

Figure 11:
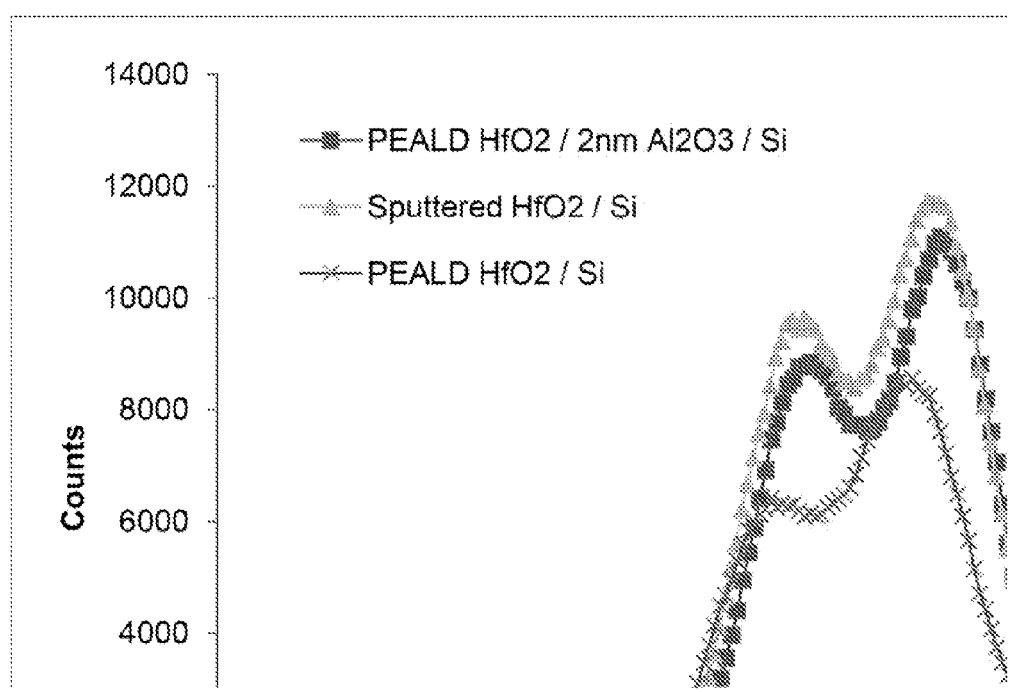
FIG. 11 is a graph showing high resolution hafnium 4 f XPS scans for three hafnium oxide AR coatings. The samples were prepared with $HfO_2$ film thicknesses of ~1.2 nm in all cases to enable the XPS to characterize the interface properties. The sputtered hafnium oxide deposited on silicon and the PEALD $HfO_2$ grown on the 2 nm barrier layer of $Al_2O_3$ show Hf peaks consistent with the data observed for much thicker films. However, the presence of a low binding energy tail for the PEALD HfO$_2$ grown directly on silicon suggests that a chemical interaction has occurred between of the hafnium oxide and the underlying silicon (compare TEM in FIG. 10).
Figure 12:
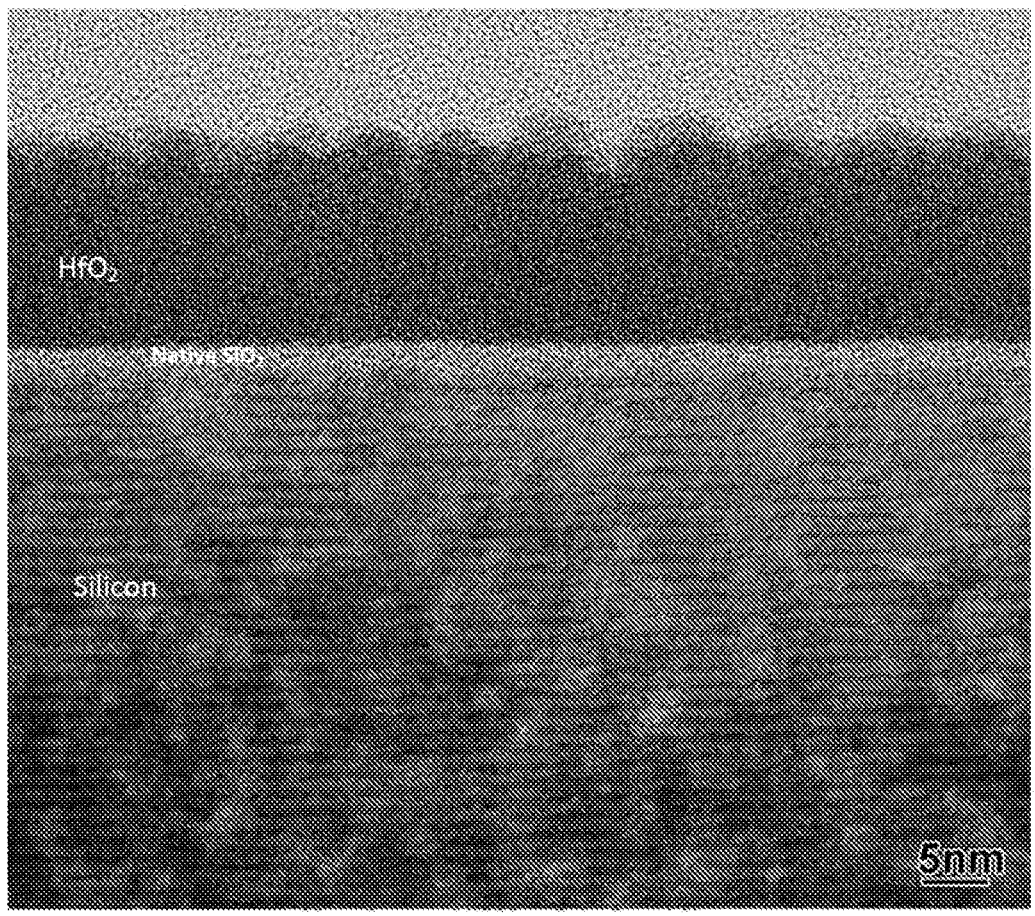
FIG. 12 is a TEM image of a sputtered HfO$_2$ thin film on a blank delta-doped silicon wafer. Unlike the case of PEALD HfO$_2$ deposited directly on silicon, there is no evidence of a large silicate interfacial layer. The lighter layer at the boundary is thought to be the native oxide that forms after the delta-doping process prior to the AR coating deposition. The sputtered HfO$_2$ film appears less dense, amorphous, and rough as compared to the corresponding PEALD HfO$_2$ bilayer (compare FIG. 11) which likely accounts for the superior performance of the PEALD HfO$_2$ bilayer as an AR coating.

X-ray photoelectron spectroscopy (XPS) was employed to provide further confirmation of whether the 2 nm aluminum oxide layer was sufficient to prevent the formation an interfacial layer. Samples were prepared where twenty five ALD cycles (~1.2 nm) of $HfO_2$ were deposited on silicon and 2 nm of $Al_2O_3$ were deposited on silicon. FIG. 11 shows the high resolution XPS scans for hafnium 4 f peaks for these two samples. The absence of the low binding energy tail for the $HfO_2$ grown on the 2 nm $Al_2O_3$ barrier layer on silicon confirms the TEM result that 2 nm is sufficient to prevent the formation of interfacial hafnium silicates. FIG. 11 also shows data for the sputtered hafnium oxide film. The sputtered hafnium 4 f results appear to be comparable to the ALD bilayer, which suggests that the poor performance of the sputtered hafnium oxide (shown in FIG. 5) is not related to a chemical interaction between the coating and the silicon surface of the CCD. This conclusion is supported by high resolution TEM analysis of a sputtered $HfO_2$ film on delta-doped silicon (FIG. 12). Unlike the case of PEALD $HfO_2$ deposited directly on silicon, there is no evidence of a large silicate interfacial layer. The lighter layer at the boundary is likely the native oxide that forms after the delta-doping process prior to the AR coating deposition. However, the sputtered $HfO_2$ film appears noticeably less dense, amorphous, and rough as compared to the corresponding PEALD $HfO_2$ bilayer (see FIG. 11). This may account for the superior performance of the PEALD bilayer as an AR coating.

Since the problem that the aluminum oxide solves is degradation of the doping layer near the back surface of the thinned wafer, it is expected that the aluminum oxide layer will control the degradation of the back surface of a silicon photodetector without regard to how the doping layer is fabricated. By way of example, it is expected that application of the $Al_2O_3$ technology will be equally effective if the doping near the back surface is provided using MBE, ion implantation, CVD, or any other deposition process.

Figures 13A, 13B:
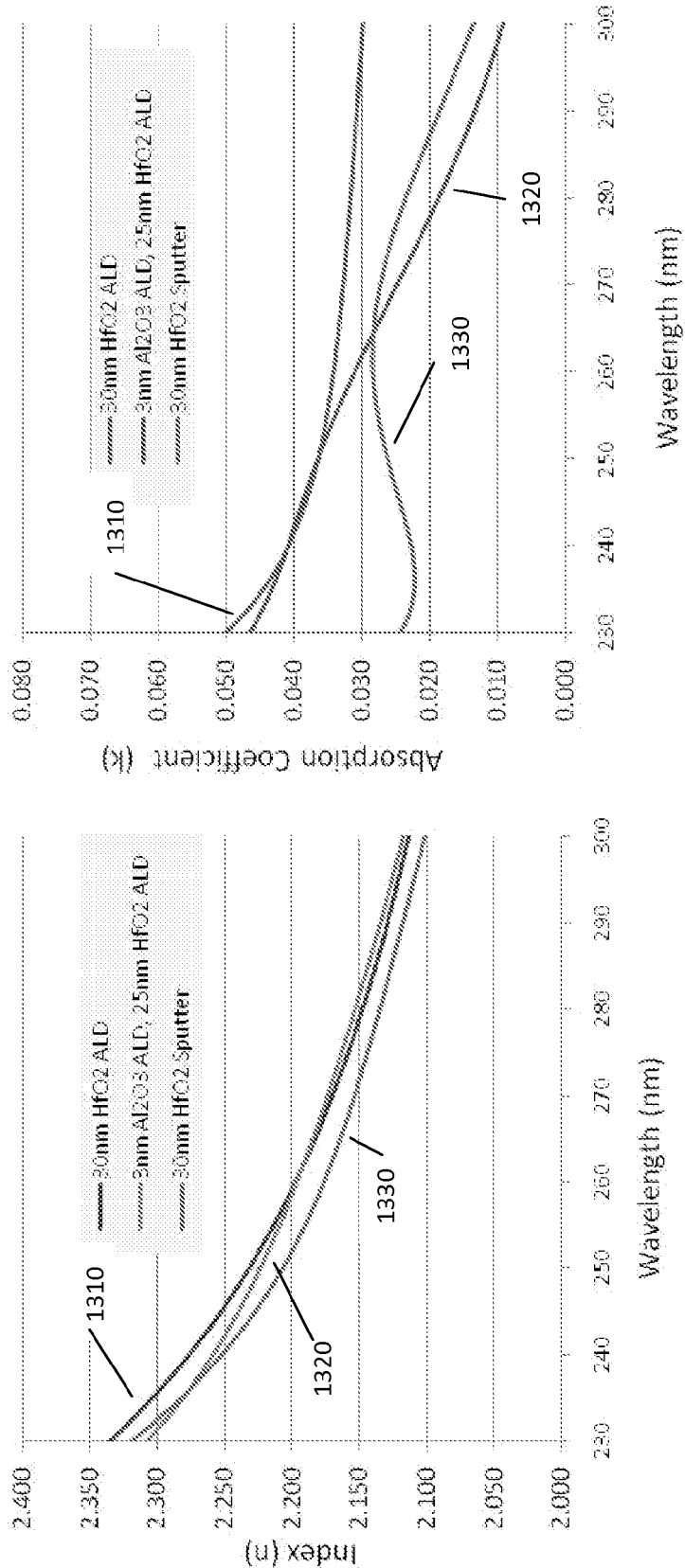
FIG. 13A and FIG. 13B are graphs showing optical properties of ALD and sputter deposited AR coatings.

FIG. 13A and FIG. 13B show the optical properties of the $HfO_2$ ALD AR single and bilayer coatings as compared to the sputtered $HfO_2$ thin films. These three coatings were deposited on 1 inch diameter silicon substrates and the optical properties were calculated by J.A. Woollam, Inc. using ultraviolet spectroscopic ellipsometry. The roughness values, as estimated by the model fits, for the two ALD samples were substantially lower than the sputtered $HfO_2$ sample (1.3 nm vs. 3.5 nm). The superiority of the aluminum oxide/hafnium oxide ALD bilayer as compared $HfO_2$ alone is clear both from the effective index of refraction of the deposited films and the lower absorption coefficient. This supports the conclusion that the hafnium component of the PEALD bilayer stack has a higher density than the sputtered film. It also is consistent with the XPS observation that the $HfO_2$ in the PEALD bilayer has not reacted with the silicon substrate.

Figure 14:
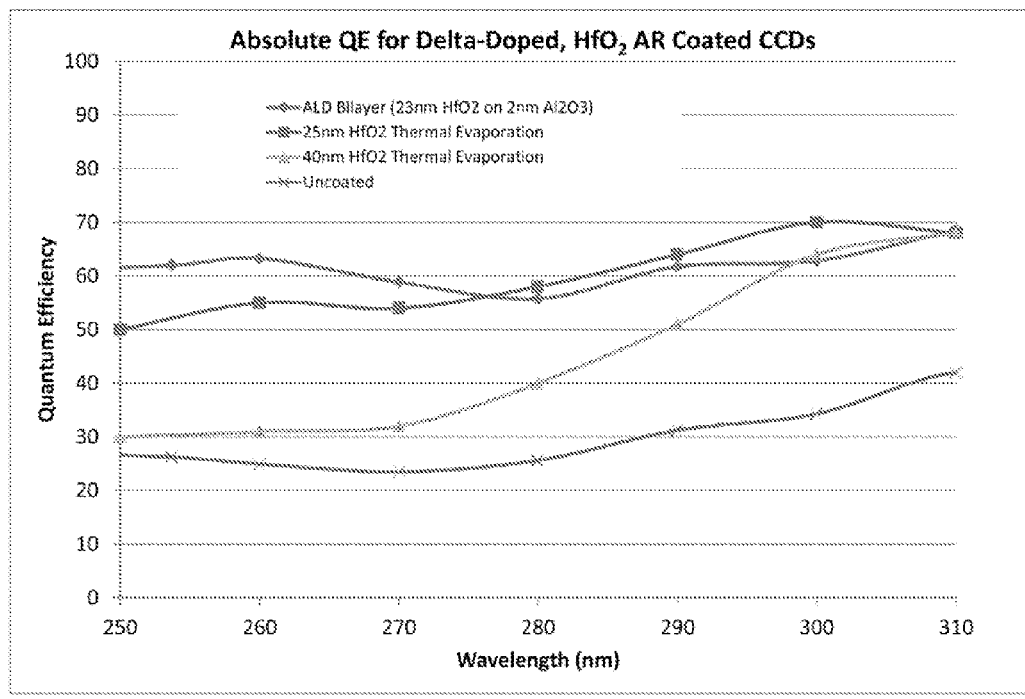
FIG. 14 is a graph that compares the quantum efficiencies vs. wavelength of delta-doped CCDs with different HfO$_2$ AR coatings. The ALD bilayer outperforms the thermally evaporated HfO$_2$ coatings at shorter wavelengths. This may be due to superior film quality. Alternatively the slight difference in thickness between the 23 nm ALD and 25 nm evaporated films may affect the behavior. The data are compared to the quantum efficiency of an uncoated CCD. The sputter deposited HfO$_2$ data is not shown here, due to its negligible UV response.

FIG. 14 compares the quantum efficiency of hafnium oxide AR coatings produced by thermal evaporation and PEALD. The ALD bilayer outperforms the thermally evaporated $HfO_2$ coatings at shorter wavelengths. This may be due to superior film quality, or the slight difference in thickness between the 23 nm ALD and 25 nm evaporated films. The sputter deposited $HfO_2$ data is not shown here, due to its negligible UV response. The TEM, XPS, and ellipsometry observations discussed above provide insight into the mechanisms for why the quantum efficiency of the sputtered AR coatings is degraded in comparison to the other techniques. Although the differences in optical constants appear to be relatively minor between these different techniques, it appears that the roughness and lower density of the sputtered $HfO_2$ is sufficient to dramatically impact the AR coating performance. It is possible that by employing a small amount of bias to the substrate during to smooth and density the film would help improve the quality of the sputtered $HfO_2$ AR coating. However, it appears that the ALD technique would always be preferable to this approach, as the technique enables excellent thickness control as well as multilayer film growths.

Figure 15:
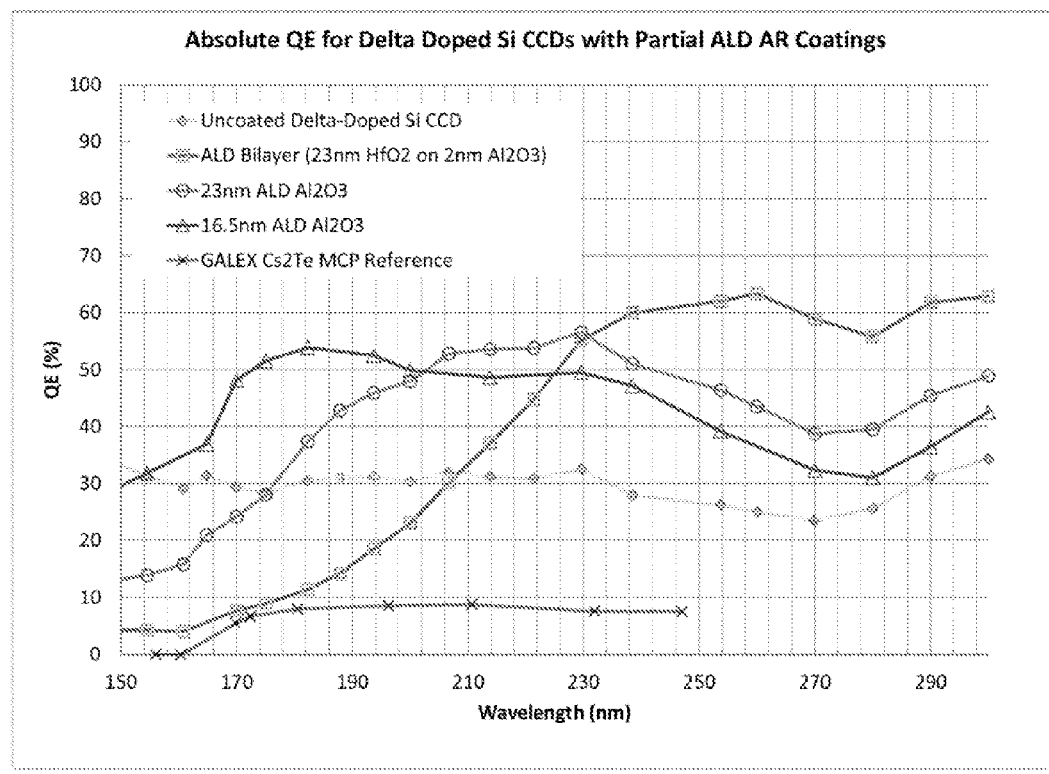
FIG. 15 is a graph showing the quantum efficiency vs. wavelength for AR coated delta-doped CCDs as compared to that of the uncoated portion of a delta-doped CCD and the multi-channel plate onboard GALEX. Film type and thicknesses have been selected to optimize QE in defined wavelength regions. These wavelength regions are 170-200 nm (16.5 nm Al$_2$O$_3$), 190-240 nm (23 nm Al$_2$O$_3$), and 230-300 nm (23 nm HfO$_2$/2 nm Al$_2$O$_3$), and were chosen based on the index of available UV transparent materials.

FIG. 15 shows the quantum efficiency measured for the three different ALD AR coatings that we have characterized. The performance of one of the uncoated sides of these is presented as a reference for all three CCDs. The thicknesses of these ALD coatings were selected to maximize quantum efficiency over this range, dividing the spectra into three different near ultraviolet (NUV) and far ultraviolet (FUV) bands. The bands selected were 170 to 200 nm, 190 to 240 nm, and 230 to 300 nm. Through judicious choices of these coatings and their thicknesses, the absolute quantum efficiency can be maintained above 50% for the entire range from 170 nm to 300 nm.

Figure 16:
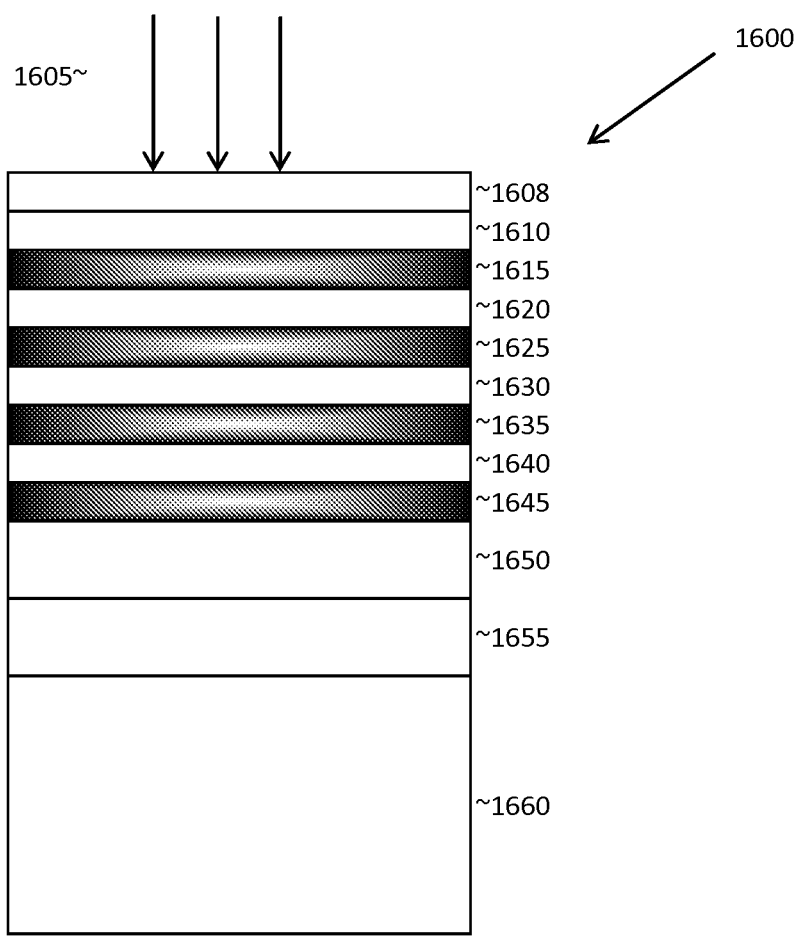
FIG. 16 is a schematic diagram (not to scale) of a back illuminated imaging device having at least one delta doped layer and no anti reflection coating.

FIG. 16 is a schematic diagram (not to scale) that illustrates a cross section of a back illuminated imaging device 1600 having at least one delta doped layer and no anti reflection coating. In this example, a silicon semiconductor wafer is described, having deliberately provided semiconductor devices thereon. In FIG. 16, semiconductor devices (such as a CCD array in one embodiment) are provided as the CMOS layer 1655. A handle wafer 1660 may be provided as shown at the bottom of FIG. 16. Illumination represented by arrows 1605 is expected to impinge on the wafer from the back surface side (opposite to the surface where the semiconductor devices are provided). Layer 1650 of the wafer represents the remaining bulk material (such as a silicon epitaxial layer) with a surface present after an optional thinning process is applied to the back side of device 1600. Layers 1615, 1625, 1635, and 1645 and layers 1620, 1630 and 1640 are grown on the thinned wafer. In the example illustrated, layers 1615, 1625, 1635 and 1645, presented in partially darkened fill, represent four doped layers that include a density of a deliberately added dopant species (such as a p-type dopant such as boron, or an n-type dopant such as phosphorus or antimony). The device 1600 need not have exactly four doped layers, but in general will have at least one doped layer, and may have a plurality M of doped layers, where M is an integer greater than 1. The dopant concentration in the M doped layers need not be the same, but in principle can be selected to be the same concentrations or to be different concentrations. Interleaved between layers 1615, 1625, 1635 and 1645 are M−1 (here with M=4, M−1=3) layers 1620, 1630 and 1640 that are not deliberately doped (also referred to as "undoped layers"), for example, layers that are substantially silicon having no deliberately added dopant. Structures with M=2, M=3 and M=4 have been demonstrated. Layer 1610 is a final semiconductor layer of the wafer provided by growth after all of layers 1615 through 1645 are grown, so that any necessary electrical contacts or optical antireflection layers can be provided on the back surface of device 1600. Layer 1608 is a surface oxide, such as $SiO_2$. In general, the plurality of M doped layers 1615, 1625, 1635 and 1645 can be as thin as a single layer of silicon (approximately 2.5 Angstroms) and can be doped at concentrations up to approximately $2\times10^{14}$ $cm^{-2}$ dopant atoms. One way to measure dopant density is sheet density, which is measured in dopant atoms per square cm. The M−1 layers 1620, 1630 and 1640 that are not deliberately doped can have thicknesses in the range of 5 Angstroms to 40 Angstroms, and are preferably grown with thicknesses in the range of 10 Angstroms to 30 Angstroms.

Figure 17:
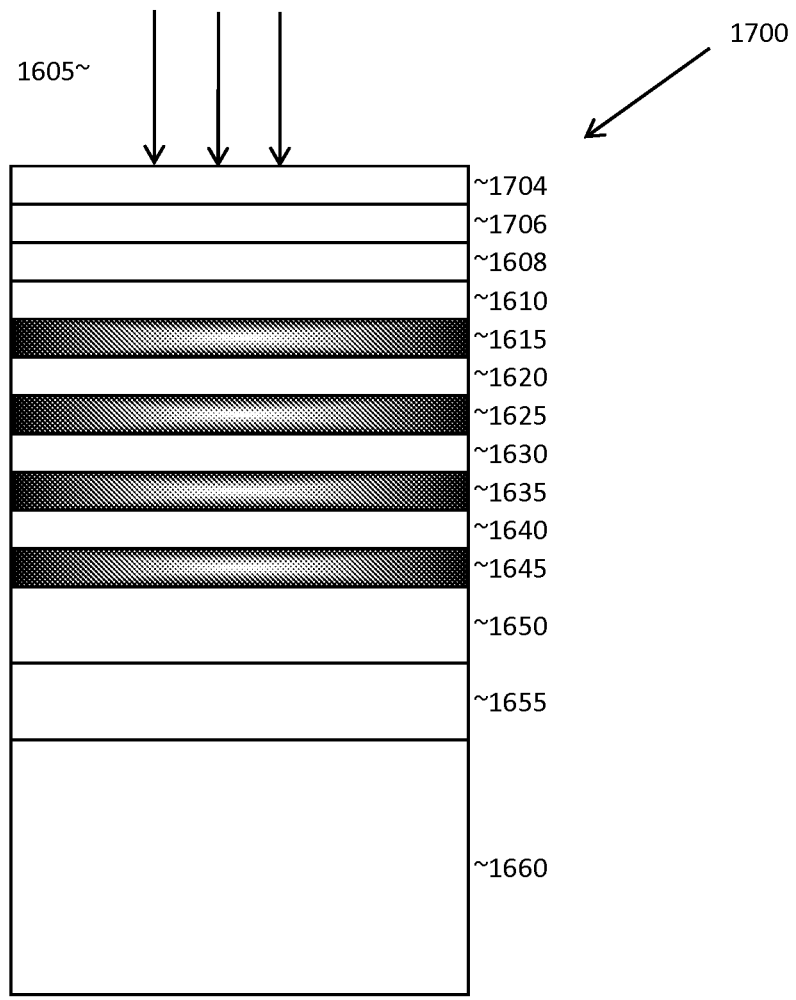
FIG. 17 is a schematic diagram (not to scale) of a back illuminated imaging device having at least one delta doped layer, an ALD Al$_2$O$_3$ layer and at least one anti reflection coating.

FIG. 17 is a schematic diagram (not to scale) of a back illuminated imaging device 1700 having at least one delta doped layer, an ALD $Al_2O_3$ layer 1706 and a layer 1704 comprising at least one anti reflection coating. All of the other layers are as described in FIG. 16. In some embodiments, layer 1706 may be a layer of a material other than $Al_2O_3$ that is chemically resistant to reaction with layers that are present on opposite sides of layer 1706. For purposes of exposition, a layer 1706 that satisfies the above conditions can be referred to as a "buffer layer."

A back-illuminated photodetector device having at least one delta-doped layer close to the surface that is expected to receive the illumination and having a thin layer of a chemically stable (or chemically-resistant) material such as $Al_2O_3$ that is provided as a layer that provides separation between an oxide such as $SiO_2$ present on the device and materials applied to provide an antireflection coating so as to prevent their chemical reaction, but that is thin enough to be optically innocuous, can be fabricated as described hereinabove. The antireflection coating is fabricated from one or more materials which can be selected to provide optical transparency in a desired region of the electromagnetic spectrum. In some embodiments, the antireflection coating can include one material in a single layer. In other embodiments, the antireflection coating can comprise a plural number of layers of different materials.

It is recognized that any material, of any thickness, will in principle modify or change the properties of electromagnetic illumination that interacts with the material. As used herein, the term "optically innocuous" means that the chemically stable or chemically-resistant material is thin enough that it does not interact with incident illumination having a wavelength of interest to an extent that the optical properties of the illumination are changed enough to affect a measurement of such optical properties. The optical properties of the incident illumination that are expected not to be affected can include, but need not be limited to, one or more of such properties as an intensity, a wavelength, and a polarization of the incident illumination.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A silicon photodetector, comprising:
   a silicon die having at least one photodetector element configured to detect electromagnetic radiation in a wavelength of interest, said silicon die having a silicon surface configured to receive said electromagnetic radiation, and having at least one terminal configured to provide an electrical signal representative of a property of said electromagnetic radiation, said silicon die having a doped layer situated within 5 nanometers of said surface, said silicon die having a silicon oxide layer with a first oxide surface adjacent said silicon surface and a second oxide surface on a side opposite said first oxide surface;
   a buffer layer comprising a chemically-resistant material having a first buffer layer surface adjacent said second surface of said silicon oxide layer, said buffer layer of said chemically-resistant material having a thickness configured to render said buffer layer of chemically-resistant material optically innocuous at said wavelength of interest, and having a second buffer layer surface on a side opposite said first buffer layer surface; and
   an antireflection layer configured to be transparent to electromagnetic radiation in said wavelength of interest, said antireflection layer having a first antireflection layer surface adjacent said second buffer layer surface;
   said buffer layer configured to prevent said electromagnetic radiation in said wavelength of interest from causing a chemical reaction of said silicon oxide layer with said antireflection layer.

2. The silicon photodetector of claim 1, wherein said doped layer situated within 5 nanometers of said surface is a delta-doped layer.

3. The silicon photodetector of claim 1, wherein said doped layer situated within 5 nanometers of said surface is a doped layer fabricated using MBE technology.

4. The silicon photodetector of claim 1, wherein said doped layer situated within 5 nanometers of said surface is a doped layer fabricated using ion implantation.

5. The silicon photodetector of claim 1, wherein said doped layer situated within 5 nanometers of said surface is a doped layer fabricated using chemical vapor deposition.

6. The silicon photodetector of claim 1, wherein said buffer layer comprising a chemically-resistant material is $Al_2O_3$.

7. The silicon photodetector of claim 6, wherein said $Al_2O_3$ buffer layer has a thickness in the range of 1 nm to 23 nm.

8. The silicon photodetector of claim 1, wherein said antireflection layer comprises at least one material selected from the group of materials consisting of $HfO_2$, $MgF_2$, $Al_2O_3$, $SiO_2$, LiF, $Si_3N_4$, and MgO.

9. The silicon photodetector of claim 1, wherein said electromagnetic radiation in a wavelength of interest is electromagnetic radiation in the wavelength range of 100 nm to 300 nm.

10. A method of providing an antireflection layer on a silicon photodetector, comprising the steps of:
providing an silicon photodetector comprising a silicon die having at least one photodetector element configured to detect electromagnetic radiation in a wavelength of interest, and having at least one terminal configured to provide an electrical signal representative of a property of said electromagnetic radiation;
producing on said silicon die a doped layer with an overcoat of silicon configured to situate said doped layer within 5 nanometers of a silicon surface;
creating a silicon oxide layer with a first oxide surface adjacent said silicon surface and a second oxide surface on a side opposite said first oxide surface;
depositing on said second oxide surface of said silicon oxide layer a buffer layer comprising a chemically-resistant material having a first buffer layer surface adjacent said second surface of said silicon oxide layer, said buffer layer of said chemically-resistant material having a thickness configured to render said buffer layer of chemically-resistant material optically innocuous at said wavelength of interest, and having a second buffer layer surface on a side opposite said first buffer layer surface; and
depositing on said second buffer layer surface an antireflection layer configured to be transparent to electromagnetic radiation in said wavelength of interest, said antireflection layer having a first antireflection layer surface adjacent said second buffer layer surface;
whereby said buffer layer is configured to prevent said electromagnetic radiation in said wavelength of interest from causing a chemical reaction of said silicon oxide layer with said antireflection layer.

11. The method of providing an antireflection layer on a silicon photodetector of claim 10, wherein said doped layer situated within 5 nanometers of said surface is a delta-doped layer.

12. The method of providing an antireflection layer on a silicon photodetector of claim 10, wherein said doped layer situated within 5 nanometers of said surface is a doped layer fabricated using MBE technology.

13. The method of providing an antireflection layer on a silicon photodetector of claim 10, wherein said doped layer situated within 5 nanometers of said surface is a doped layer fabricated using ion implantation.

14. The method of providing an antireflection layer on a silicon photodetector of claim 10, wherein said doped layer situated within 5 nanometers of said surface is a doped layer fabricated using chemical vapor deposition.

15. The method of providing an antireflection layer on a silicon photodetector of claim 10, wherein said a buffer layer comprising a chemically-resistant material is a buffer layer of $Al_2O_3$.

16. The method of providing an antireflection layer on a silicon photodetector of claim 15, wherein said buffer layer of $Al_2O_3$ has a thickness in the range of 1 nm to 23 nm.

17. The method of providing an antireflection layer on a silicon photodetector of claim 10, wherein said buffer layer of $Al_2O_3$ is deposited using atomic layer deposition.

18. The method of providing an antireflection layer on a silicon photodetector of claim 10, wherein said antireflection layer comprises at least one material selected from the group of materials consisting of $HfO_2$, $MgF_2$, $Al_2O_3$, $SiO_2$, LiF, $Si_3N_4$, and MgO.

19. A silicon photodetector, comprising:
a silicon die having at least one photodetector element configured to detect electromagnetic radiation in a wavelength of interest, said silicon die having a silicon surface configured to receive said electromagnetic radiation, and having at least one terminal configured to provide an electrical signal representative of a property of said electromagnetic radiation, said silicon die having a doped layer situated within 5 nanometers of said surface, said silicon die having a silicon oxide layer with a first oxide surface adjacent said silicon surface and a second oxide surface on a side opposite said first oxide surface; and
a chemical passivation layer comprising a chemically-resistant material having a first chemical passivation layer surface adjacent the second surface of the silicon oxide layer, and having a second chemical passivation layer surface on a side opposite the first chemical passivation layer surface, the chemical passivation layer configured to be transparent to electromagnetic radiation in the wavelength of interest, the chemical passivation layer configured to prevent the electromagnetic radiation in the wavelength of interest from causing a chemical reaction of the silicon oxide layer.

* * * * *